(12) United States Patent
Kim

(10) Patent No.: US 8,557,618 B2
(45) Date of Patent: Oct. 15, 2013

(54) PHOTO MASK AND METHOD OF MANUFACTURING IN-PLANE-SWITCHING MODE LIQUID CRYSTAL DISPLAY DEVICE USING THE SAME

(75) Inventor: Tae Gyun Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 367 days.

(21) Appl. No.: 12/641,905

(22) Filed: Dec. 18, 2009

(65) Prior Publication Data

US 2010/0210053 A1 Aug. 19, 2010

(30) Foreign Application Priority Data

Feb. 18, 2009 (KR) .................. 10-2009-0013611

(51) Int. Cl.
*H01L 21/00* (2006.01)
(52) U.S. Cl.
USPC .................. 438/30; 257/E21.533; 430/5
(58) Field of Classification Search
USPC .................. 438/30; 430/5; 257/E21.211
See application file for complete search history.

(56) References Cited

U.S. PATENT DOCUMENTS

2008/0136990 A1* 6/2008 Kimura .................. 349/46
2009/0109364 A1* 4/2009 Yang et al. .............. 349/46

FOREIGN PATENT DOCUMENTS

| KR | 10-0208441 B1 | 7/1999 |
| KR | 10-2001-0036104 A | 5/2001 |
| KR | 10-2004-0078225 A | 9/2004 |

OTHER PUBLICATIONS

Korean Office Action 10-2009-0013611 dated Jun. 22, 2013.

* cited by examiner

*Primary Examiner* — Julio J Maldonado
*Assistant Examiner* — Sonya D McCall Shepard
(74) *Attorney, Agent, or Firm* — Morgan, Lewis & Bockius LLP

(57) ABSTRACT

A photo mask is disclosed.
The photo mask includes a mask substrate, and a mask pattern formed to include a plurality of unit mask patterns which are arranged in a single line for a fine pattern formation. The unit mask pattern is configured to include a body portion positioned at a center and wing portions formed in a triangular shape at both sides of the body portion.

4 Claims, 8 Drawing Sheets

PHOTO MASK AND METHOD OF MANUFACTURING IN-PLANE-SWITCHING MODE LIQUID CRYSTAL DISPLAY DEVICE USING THE SAME

CROSS-REFERENCE TO RELATED APPLICATION

This application claims priority under 35 U.S.C. 119 to Korean Patent Application No. 10-2009-0013611, filed on Feb. 18, 2009, which is hereby incorporated by reference in its entirety.

BACKGROUND

1. Field of the Disclosure

This disclosure relates to a photo mask and a method of manufacturing a liquid crystal display device of an in-plane-switching (IPS) mode using the same.

2. Description of the Related Art

In general, liquid crystal display (LCD) devices control the light transmittance of dielectric anisotropy liquid crystal using an electric field, so as to display pictures. To this end, these LCD devices each include an LCD panel configured to include a plurality of liquid crystal cells arranged in a matrix shape for the display of pictures, and a driving circuit configured to drive the LCD panel. The LCD panel is classified into an IPS mode or a vertical electric field mode, according to the direction of the electric field used for driving the liquid crystal.

An LCD device of the vertical electric field mode drives the liquid crystal using the vertical electric field between a pixel electrode and a common electrode which are respectively formed on two substrates disposed opposite to each other. As such, the vertical electric field mode LCD device has a large aperture ratio, but it has a narrow viewing angle.

On the other hand, a LCD device of the IPS mode drives the liquid crystal using the horizontal electric field between pixel and common electrodes which are disposed parallel to each other on a substrate. Accordingly, the IPS mode LCD device has a wider viewing angle than that of the vertical electric field mode LCD device.

FIG. 1 is a perspective view showing an IPS mode LCD panel of the related art. Referring to FIG. 1, the IPS mode LCD panel includes an upper substrate 11 provided with a color filter array, a lower substrate 1 provided with a thin film transistor array, and a liquid crystal molecules 18 filled between the two substrates 1 and 11.

The color filter array substrate includes a black matrix 12, color filters 14, and an overcoat layer 16 which are formed on the upper substrate 11. The black matrix 12 is formed to overlap with thin film transistors (TFTs) 6, gate lines 2, and data lines 4 on the TFT array substrate 1 given below, and define cell regions in which the color filters 14 will be formed. Such a black matrix 12 prevents light leakage and absorbs external light so that the contrast of an LCD panel increases. The color filters 14 are formed on the cell regions divided by the black matrix 12. The cell regions can be classified into red, green, and blue regions. As such, the color filters can include red, green, and blue color filter patterns formed on the respective red, green, and blue regions. The overcoat layer 16 is formed on the upper substrate 11 covered with the black matrix 12 and the color filters 14.

The TFT array substrate includes TFTs 6 formed on the lower substrate 1, pixel electrodes 8 each connected to the TFTs 6, and common electrodes 10 parallel to the pixel electrodes 8. Each of the TFTs 6 responds to a gate signal applied to its gate electrode and applies a data signal on its source electrode to the respective pixel electrode 8 via its drain electrode. To this end, the gate electrode of the TFT 6 is connected to gate line 2 transferring the gate signal, and the source electrode of the TFT 6 is connected to respective data line 4 transferring the data signal. The pixel electrode 8 is connected to the drain electrode of the respective TFT 6 and receives the data signal. The source and drain electrodes of the TFT 6 make in ohmic contact with a semiconductor pattern (not shown) which overlaps with the gate electrode in the center of a gate insulation film. The pixel electrode 8 and a finger portion of the common electrode 10 are formed parallel to each other on each of the pixel regions which are defined by crossing the gate lines 2 and the data lines 4. Each of the common electrodes 10 is connected to a respective common line 9 parallel to the gate line 2. The common electrode 10 receives a common voltage, which is used for driving the liquid crystal molecules 18, from the common lines 9.

A horizontal electric field is generated by the data signal applied to the pixel electrode 8 and the common voltage applied to the common electrode 10. The horizontal electrode field forces the liquid crystal molecules to rotate on the basis of a horizontal direction. The light transmittance of the pixel region varies along the rotated amount of the liquid crystal molecules to the horizontal direction so that a picture is displayed on the IPS mode LCD panel. The liquid crystal molecules driven by the horizontal electric field have a lower birefringence variation ratio to a viewing angle direction, in comparison with those driven by a vertical electric field. As such, the IPS mode LCD panel can improve the viewing angle.

However, the liquid crystal molecules of the IPS mode LCD panel are not uniformly driven throughout the pixel region, as shown in FIG. 2. Actually, the liquid crystal molecules disposed between the pixel electrode 8 and the common electrode 10 are normally driven by the horizontal electric field generated between the pixel electrode 8 and the common electrode 10, thereby controlling a transmission light amount. On the other hand, the molecules disposed to overlap with the pixel electrode 8 and the common electrode 10 cannot be driven. This results from the fact that the horizontal electric field is not formed in a space overlapping with the pixel and common electrodes 8 and 10. As such, the aperture ratio of the pixel region is reduced.

In order to enhance the aperture ratio in the IPS mode LCD panel, the number of effective opening regions W provided by the alternately arranged fingers of the pixel and common electrodes should increase, or the width of each effective opening region W should be enlarged. To rectify this, the fingers of the pixel and common electrodes 8 and 10 parallel to each other must have a reduced width. However, the widths of the fingers of the pixel and common electrodes 8 and 10 are limited to exposure resolution in a photolithography process.

FIGS. 3A to 3C are cross-sectional view illustrating step-by-step a electrode formation method using a photolithography process according to a related art. Referring to FIG. 3A, a conductive layer 22 is formed on a substrate 20, and a photo resist pattern 24 is formed on the conductive layer 22. The photo resist pattern 24 is prepared through exposing, developing, and baking processes. The exposing process allows a photo resist film to be partially exposed to light passing through a mask, so that a mask pattern is transcribed onto the photo resist film. In this case, the exposure resolution limit of present exposure equipment makes it difficult to form a photo resist pattern in a line width below 5 μm. As such, it is also difficult to form a conductive pattern in a line width below 4 μm.

Subsequently, the conductive layer 22 is etched through an etching process, thereby forming an electrode 26 fully covered with the photo resist pattern 25 as shown in FIG. 3B. Then, the photo resist pattern 24 is removed by a strip process, as shown in FIG. 3C. Characteristically, a wet etching process forces the conductive layer 22 to be characteristically overetched. As such, the electrode 26 is formed to have a line width narrower than that of the photo resist pattern 24. Nevertheless, it is actually difficult to form the electrode 26 in a line width below 5 µm, even though the photo resist pattern 24 is prepared to have a minimum line width of 5 µm.

In other words, the minimum widths of the pixel and common electrodes in the IPS mode LCD panel are limited to the resolution of exposure equipment. Therefore, the aperture ratio of the IPS mode LCD panel can be enhanced above a critical value.

BRIEF SUMMARY

Accordingly, the present embodiments are directed to a photo mask that substantially obviates one or more of problems due to the limitations and disadvantages of the related art, and a method of manufacturing an IPS mode LCD device using the same.

An object of the present embodiment is to provide a photo mask adapted to enhance an aperture ratio, and an IPS mode LCD device manufacturing method using the same.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, a photo mask includes: a mask substrate; and a mask pattern formed to include a plurality of unit mask patterns which are arranged in a single line for a fine pattern formation. The unit mask pattern is configured to include a body portion positioned at a center and wing portions formed in a triangular shape at both sides of the body portion.

The body portions included in the plurality of unit mask patterns are connected to one another. The body portion is formed to have a length corresponding to a ratio of 2:1 to a height of the wing portion, and the wing portion of the triangular shape is formed to have an apex angle of substantially 90°.

The body portion is formed to have a length range of 1.5~3.0 µm, and the wing portion is formed to have a height range of 1~1.5 µm.

An IPS mode LCD device manufacturing method according to another aspect of the present embodiment includes: sequentially forming a conductive layer and a photo resist film on a substrate; aligning a photo mask with a mask pattern for a fine pattern formation over the substrate covered with the photo resist film; patterning the photo resist film by performing an exposing process using the photo mask and a developing process; and forming an electrode by etching the conductive layer using the photo resist pattern as an etch mask.

The mask pattern for the fine pattern formation is formed to include a plurality of unit mask patterns arranged in a single line. Each of the unit mask patterns is configured to include a body portion positioned at a center and wing portions formed in a triangular shape at both sides of the body portion.

The body portions included in the plurality of unit mask patterns are connected to one another. The body portion is formed to have a length corresponding to a ratio of 2:1 to a height of the wing portion, and the wing portion of the triangular shape is formed to have an apex angle of substantially 90°.

The electrode is configured to include a pixel electrode. The conductive layer is configured include a transparent conductive layer.

The electrode is formed in a line width range of about 1.5~2.0 µm.

The IPS mode LCD device manufacturing method further includes: forming a gate electrode on the substrate; forming a gate insulation film on the substrate with the gate electrode; forming a semiconductor pattern, a source electrode, and a drain electrode on the substrate covered with the gate insulation film; and forming a passivation film, on the substrate with the source and drain electrodes, configured to include a contact hole which is formed by patterning the passivation film, before the conductive layer and the photo resist film are sequentially formed.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
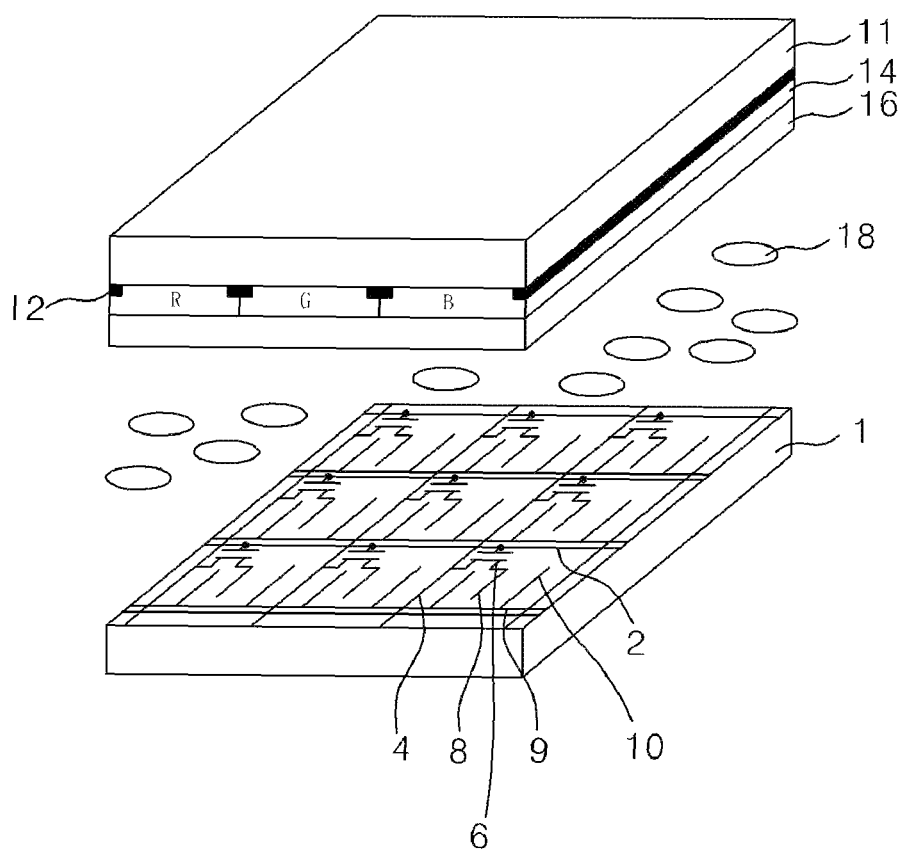
FIG. 1 is a perspective view showing an IPS mode LCD panel of the related art.
Figure 2:
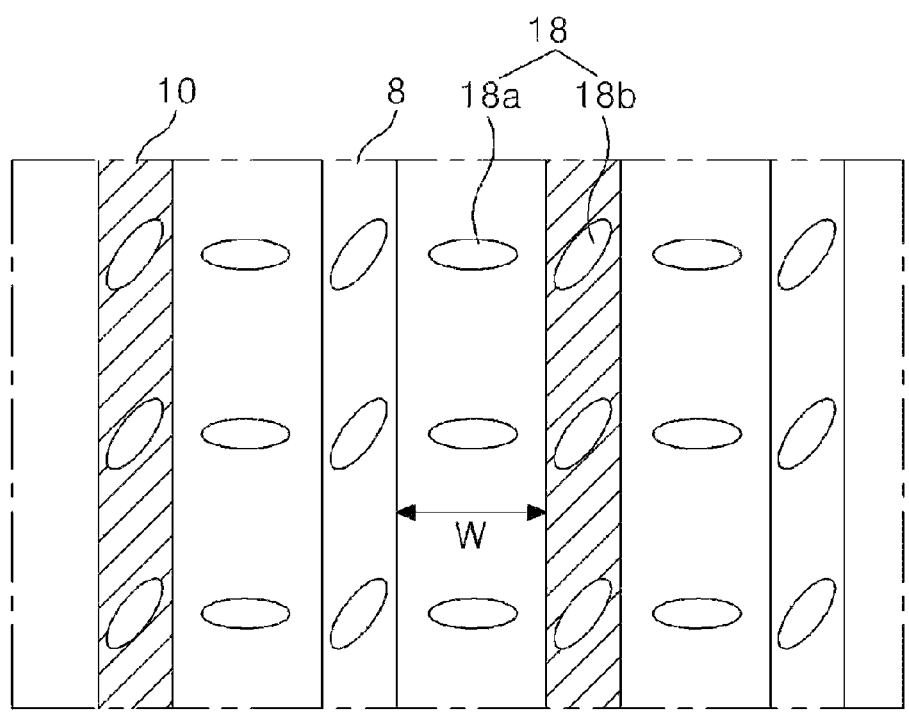
FIG. 2 is a planar view explaining the driving characteristic of liquid crystal molecules in the LCD panel shown in FIG. 1.
Figure 3A:
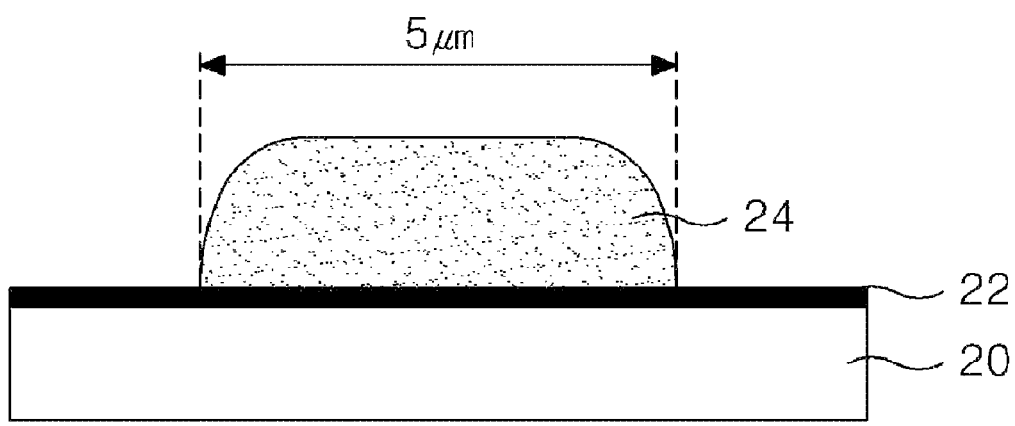
FIGS. 3A to 3C are cross-sectional views illustrating step-by-step an electrode formation method using a photolithography process according to the related art.
Figure 3B:
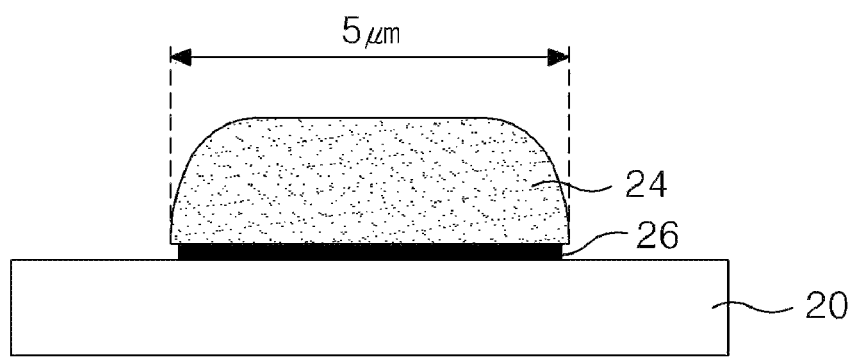
Figure 3C:
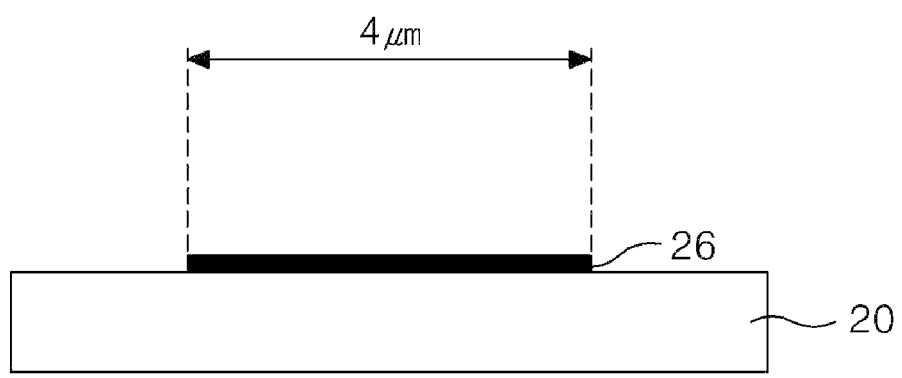

Reference will now be made in detail to the preferable embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

First, a photo mask according to an embodiment of the present disclosure will be described.

Figure 4A:
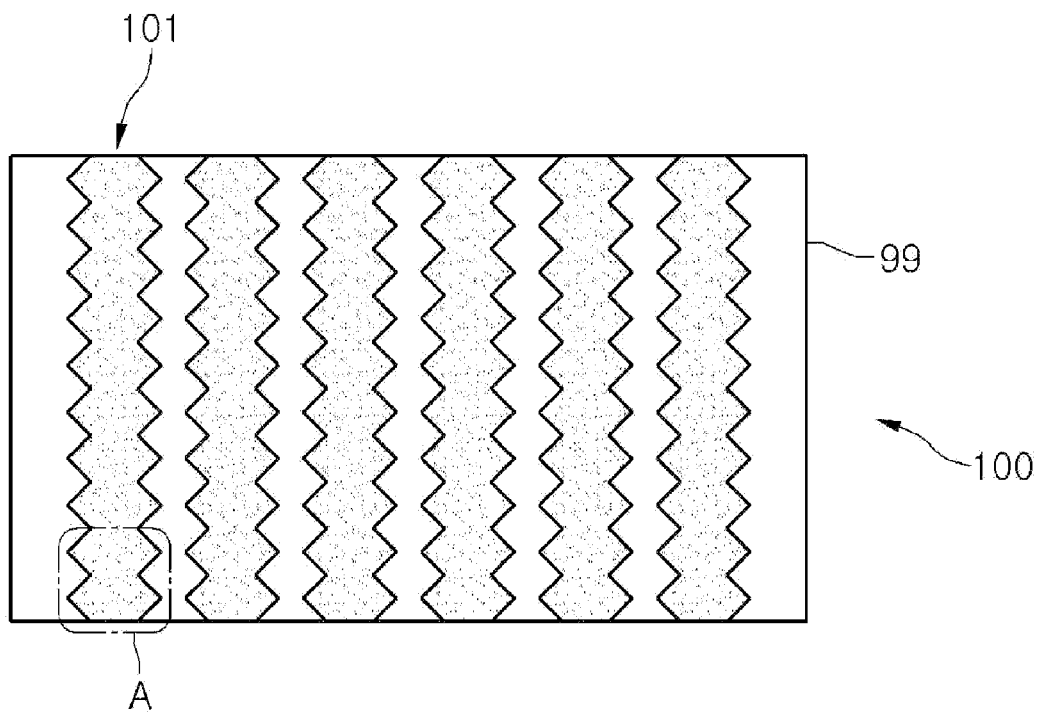
FIG. 4A is a planar view illustrating a photo mask according to an embodiment of the present disclosure.
Figure 4B:
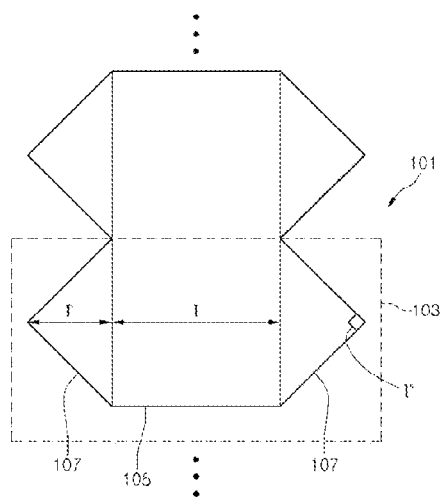
FIG. 4B is an enlarged planar view showing a region "A" in FIG. 4A.

FIG. 4A is a planar view illustrating a photo mask according to an embodiment of the present disclosure, and FIG. 4B is an enlarged planar view showing a region "A" in FIG. 4A. Referring to FIG. 4A, a photo mask 100 of the present embodiment includes a mask substrate 99 and mask patterns 101 which are used for forming fine patterns.

The mask substrate 99 includes regions on which the fine patterns 101 will be formed. Such a mask substrate 99 can be formed from a quartz material.

The mask patterns 101 used for forming fine patterns each includes a plurality of unit mask patterns 103 which are arranged in a single line, as shown in FIG. 4B. The unit mask pattern 103 includes a body portion 105 positioned at its center, and wing portions 107 formed in a triangular shape at both sides of the body portion 105. The body portions each included in the plurality of unit mask patterns 103 are connected with one another, so as to form a single mask pattern 101 to be used for forming a single fine line pattern.

The body portion 105 is formed to have a length I of about 1.5~3.0 μm, and the wing portion is formed to have a height I' of about 1~1.5 μm. The length I of the body portion 105 has a ratio of 2:1 to the height I' of the wing portion 107. The wing portion 107 is formed to have an apex angle I" of substantially 90°.

As seen in the following table 1, the fine pattern has a line width range of about 0.283-1.450 μm when the ratio of the length I of the body portion 105 to the height I' of the wing portion 107 has a ratio of 2:1 and the wing portion had an apex angle of substantially 90°.

TABLE 1

| length of body portion | height of wing portion | Apex angle of wing portion | Width of fine pattern |
| --- | --- | --- | --- |
| 2 μm | 1 μm | 90° | 1.45 ± 0.283 μm |
| 1.5 μm | 1.5 μm | 90° | 1.54 ± 0.244 μm |
| 2 μm | 1.5 μm | 90° | 2.18 ± 0.191 μm |
| 3 μm | 1 μm | 90° | 2.75 ± 0.216 μm |

In this way, the fine line patterns can be formed using the photo mask 100 with such mask patterns 101. A fine pattern formation method using the photo mask 100 will now be explained in detail referring to the attached drawings.

Figure 5A:
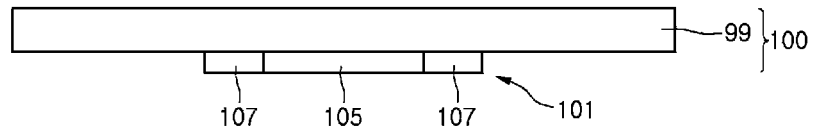
FIGS. 5A to 5C are cross-sectional views illustrating a fine pattern formation method using a photo mask according to an embodiment of the present disclosure.
Figure 5A:
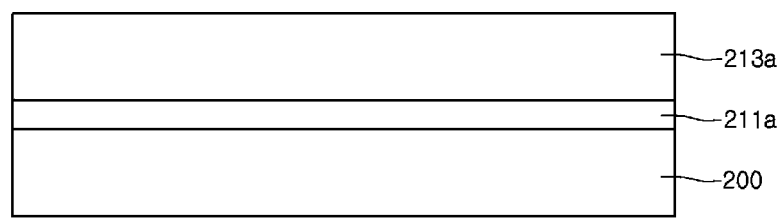
Figure 5B:
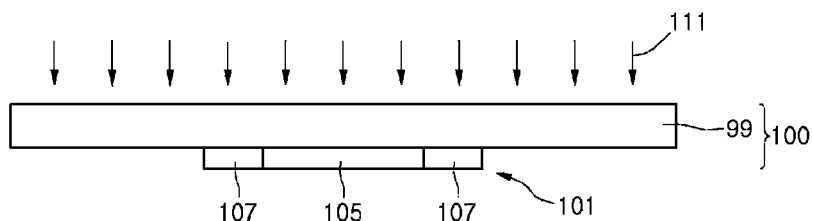
Figure 5B:
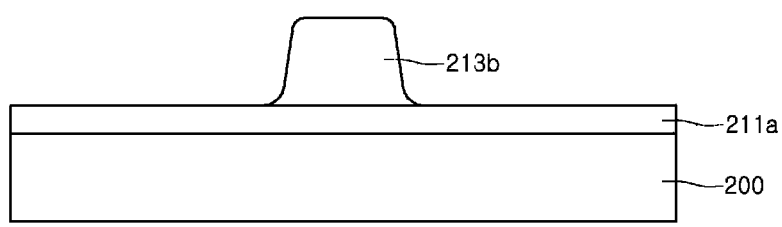
Figure 5C:
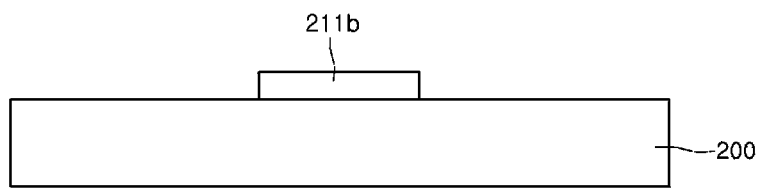

FIGS. 5A to 5C are cross-sectional views illustrating a fine pattern formation method using a photo mask according to an embodiment of the present disclosure.

A fine pattern formation method of the present embodiment allows a metal film 211a and a photo resist film 213a of a photo-sensitive material to be sequentially deposited on a substrate 200, as shown in FIG. 5A. Then, a photo mask 100 with a mask pattern 101 for a fine pattern formation is aligned above the substrate 200 covered with the photo resist film 213a.

Subsequently, an exposing process using the photo mask 100 is performed as shown in FIG. 5B. The exposing process enables light 111 to be selectively irradiated onto the photo resist film 213 through the photo mask 100 which is aligned over the substrate 200 and includes the mask pattern 101. The exposing process using the mask pattern 101 for the fine pattern formation causes diffracted light to be irradiated onto regions of the photo resist film 213a, so that the photo resist film is patterned in a width range of about 2~2.5 μm.

More specifically, the wing portions 107 of the mask pattern 101 for the fine pattern formation cause offset-interference phenomena of light 111, thereby forcing diffracted light not to be irradiated onto a region of the photo resist film 213a opposite to the body portion 105 of the mask pattern 101. As such, regions of the photo resist film 213a corresponding to the wing portions 107 and the outer regions thereof on the photo mask 100 can be removed. Accordingly, the photo resist film 213a can be patterned in a width narrower than the length of the body portion 105 of the mask pattern 101 for the fine pattern formation. In other words, the photo resist film 213a can be patterned in a width range of about 2~2.5 μm.

Afterward, a developing process is performed for the light-exposed photo resist film 213a, so as to remove a part of the photo resist film 213a corresponding to the light-exposed regions. Accordingly, photo resist patterns 213b are formed on the metal film 211a.

As shown in FIG. 5C, a metal pattern 211b is formed on the substrate 200 by etching the metal film 211a using the photo resist pattern 213b as an etch mask. Then, the photo resist pattern 213b is removed by performing a strip process for the substrate 200 with the metal pattern 211b, so that the fine pattern formation process of the present embodiment is completed. The metal pattern 211b has a line width of 1.5~2.0 μm narrower than that of the photo resist pattern 213b. This results from the fact that the metal film 211a is over-etched due to the characteristic of the etching process.

In this way, the fine pattern formation method of the present embodiment forms a metal pattern using the photo mask which includes the mask pattern 101 for a fine pattern formation. As such, the metal pattern having a line width smaller than the exposure resolution can be formed regardless of the exposure resolution D. For example, if the exposure resolution is in a range of 3~4 μm, a pattern formation method of the related art cannot form a pattern having a line width below 3 μm, but the fine pattern formation method of the present embodiment can form a fine pattern having a line width of about 1.5~2.0 μm.

Such a fine pattern formation method can be applied to a process of forming pixel electrodes which are included in an IPS mode LCD device. In this case, the line width of the pixel electrode can be greatly reduced from a previous range of about 4 μm to a range of 1.5~2.0 μm. Accordingly, the aperture ratio of the IPS mode LCD device can become larger, and furthermore the brightness of the ISP mode LCD device can be enhanced.

Subsequently, an IPS mode LCD device manufactured using the fine pattern formation process of the present embodiment and a manufacturing method thereof will be explained.

Figure 6:
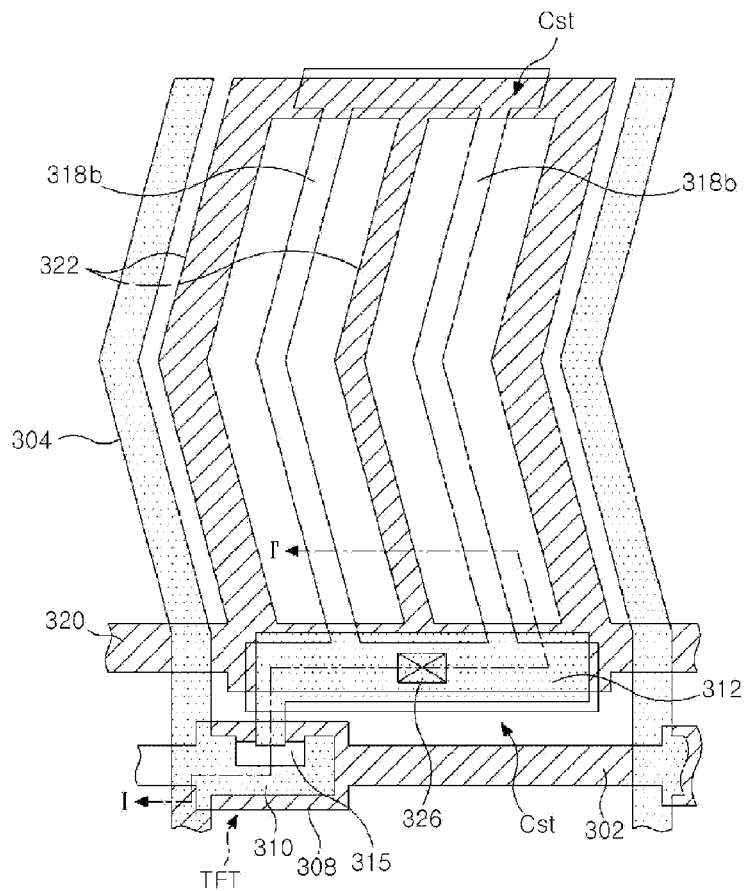
FIG. 6 is a planar view showing a thin film transistor array substrate included into an IPS mode LCD device according to an embodiment of the present disclosure.
Figure 7:
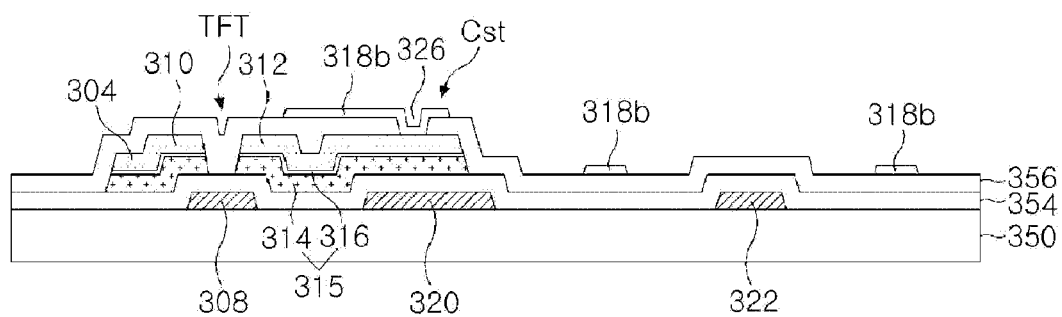
FIG. 7 is a cross-sectional view showing a thin film transistor array substrate taken along the line I-I' in FIG. 6.

FIG. 6 is a planar view showing a thin film transistor array substrate included into an IPS mode LCD device according to an embodiment of the present disclosure, and FIG. 7 is a cross-sectional view showing a thin film transistor array substrate taken along the line I-I' in FIG. 6.

A thin film transistor array substrate shown in FIGS. 6 and 7 includes: a gate line 302 and a data line 304 crossing each other in the center of a gate insulation film 352 on a lower substrate 350 and defining a pixel region; a thin film transistor TFT connected to the gate and data lines 302 and 304 and a pixel electrode 318b; and a common electrode 322 and the pixel electrode 318b forming a horizontal electric field in the pixel region. The thin film transistor array substrate further includes a common line 320 connected with the common electrode 322, and a storage capacitor Cst connected to the pixel electrode 318b.

The gate line 302 transfers a scan signal from a gate driver (not shown), and the data line 304 transfers a video data signal from a data driver (not shown). Such gate and data lines 302 and 304 are formed to cross each other in the center of the gate insulation film 354 and define pixel regions.

The thin film transistor TFT responds to the scan signal on the gate line 302 and enables the video data signal on the data line 304 to be charged and maintained in the pixel electrode 318b. To this end, the thin film transistor TFT includes: a gate electrode 308 connected to the gate line 302; a source electrode 310 connected to the data line 304; and a drain electrode 312, opposite to the source electrode 310, connected to the pixel electrode 318b. The thin film transistor TFT further includes an active layer 314 overlapping with the gate electrode 308 in the center of the gate insulation film 358, and an ohmic contact layer 316 being in ohmic contact with the active layer 314 and the source/drain electrodes 310 and 312. The active layer 314 forms a channel between the source electrode 310 and the drain electrode 312. A semiconductor pattern consisting of the active layer 314 and the ohmic contact layer 316 also overlaps with the data line 304.

The common line 320 transfers a reference voltage (i.e., the common voltage) to each of the pixels through the common electrode 322. The reference voltage is used for driving liquid crystal. The fingers of the common electrode 322 are formed to protrude parallel to the fingers of the pixel electrode 318b from the common line 320 toward the inside of the pixel region. The horizontal portion of the common electrode 322 is connected with the fingers of the common electrode 322. The fingers of the common and pixel electrodes 322 and 318b are formed in a zigzag shape together with the data line 304, as shown in FIG. 6. Alternatively, the fingers of the common and pixel electrodes 322 and 318b can be formed in the zigzag shape, while the data line 304 can be formed in a straight stripe shape. In still another manner, all of the fingers of the common and pixel electrodes 322 and 318b and the data line 304 can be formed in the straight stripe shape. In other words, the fingers of the common and pixel electrodes 322 and 318b and the data line 304 can be formed in a variety of shapes.

The pixel electrode 318b is formed to include fingers parallel to those of the common electrode 322, a first horizontal portion overlapped with the drain electrode 312, and a second horizontal portion overlapped with the horizontal portion of the common electrode 322. The first and second horizontal portions of the pixel electrode 318b are connected with the fingers of the pixel electrode 318b. The first horizontal electrode of the pixel electrode 318b is connected to the drain electrode 312 via a contact hole 326 which penetrates through the passivation (or protective) film 356. When a video data signal is applied to the pixel electrode 318b through the thin film transistor TFT, a horizontal electric field is generated between the fingers of the pixel electrode 318b and the fingers of the common electrode 322 which receives the common voltage.

The horizontal electric field rotates liquid crystal molecules, which are arranged in a horizontal direction between the thin film transistor array substrate and a color filter array substrate, due to their dielectric anisotropy. The rotated amount of the liquid crystal molecules changes the transmittance of light passing through the pixel region, thereby realizing a variety of gray scales.

The storage capacitor Cst is formed from the common line 320 and the drain electrode 312 which overlap with each other in the center of the gate insulation film 254 and the semiconductor pattern 315. This storage capacitor Cst allows the video data signal charged in the pixel electrode 318b to be stably maintained until the video data signal is applied again.

A method of manufacturing a thin film transistor array substrate of such a configuration will now be explained.

A plurality of first conductive patterns including gate lines 302, gate electrodes 322, common lines 320, and common electrodes 322 are prepared on a substrate 350 by forming a first conductive layer on the substrate 350 and patterning the first conductive layer.

Also, a gate insulation 354, semiconductor patterns 315, and a plurality of second conductive patterns are formed on the substrate 350 with the first conductive patterns by stacking the gate insulation film 354, a semiconductor layer, and a second conductive layer on the substrate with the first conductive patterns and patterning the second conductive layer and the semiconductor layer. The semiconductor pattern 315 includes an active layer 314 and an ohmic contact layer 316, and a plurality of second conductive pattern includes data lines 304, source electrodes 310, and drain electrodes 312. The semiconductor patterns 315 and the second conductive patterns can be formed through masking processes which are performed using separated masks.

Thereafter, a passivation (or protective) film 356 is formed on the substrate 350 partially covered with the second conductive patterns. Contact holes 326 are formed on the passivation film 356 by patterning the passivation film 356. Also, pixel electrodes 318b are prepared by forming a transparent conductive layer on the passivation film 356 and patterning the transparent conductive layer.

Meanwhile, the common electrodes 322 can be formed on the passivation film 356 together with the pixel electrodes 318b. In this case, the common electrodes 322 are connected to the common lines 320 via other contact holes penetrating through the passivation film 356 and the gate insulation film 354.

Such a method of manufacturing a thin film transistor array substrate forms the pixel electrodes 318b using a fine pattern formation process of the present embodiment. In this case, the line width of fingers of each pixel electrode 318b is reduced from a previous range of about 4.0 μm to a range of 1.5~2.01 μm, so that the brightness of an IPS mode LCD device is enhanced. The fine pattern formation process of the present disclosure form forming the pixel electrodes 318b will now be described as follows.

Figure 8A:
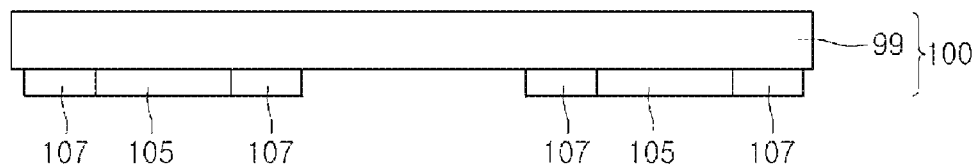
FIGS. 8A to 8C are cross-sectional views illustrating a method of forming pixel electrodes included into an IPS mode LCD device according to an embodiment of the present disclosure.
Figure 8A:
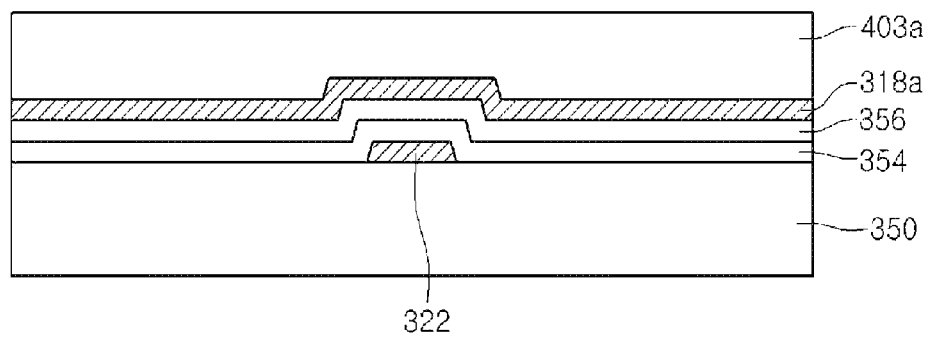

As shown in FIG. 8A, a transparent conductive layer 318a and a photo resist film 403a of a sensitive material are sequentially deposited on a substrate 350 stacked with a common electrode 322, a gate insulation film 354, and a passivation film 356. Then, a photo mask 100 with mask patterns 101 for a fine pattern formation is aligned over the substrate 350 covered with the photo resist film 403a.

Figure 8B:
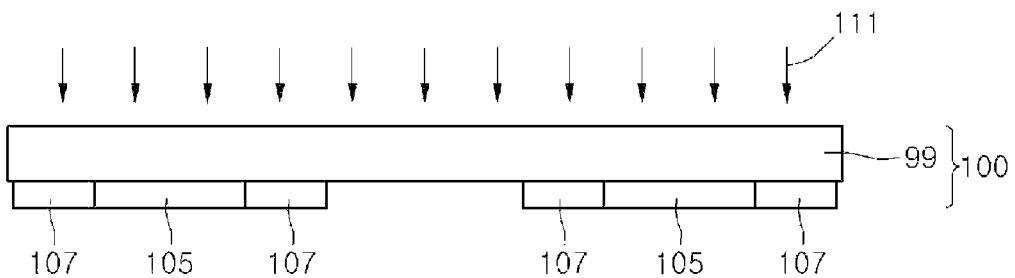
Figure 8B:
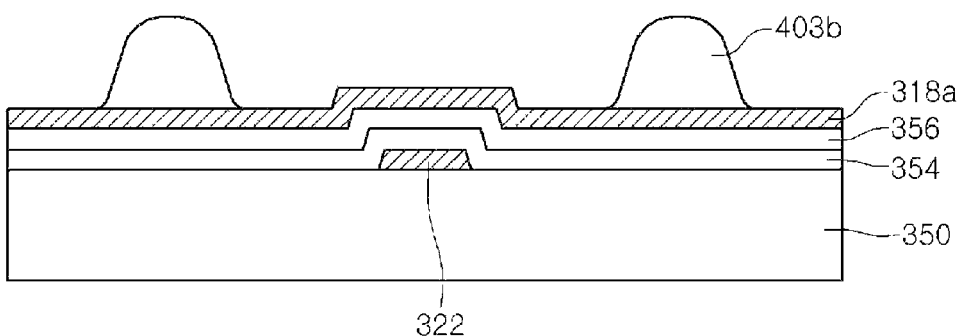

Subsequently, an exposing process using the photo mask 100 is performed as shown in FIG. 8B. The exposing process enables light 111 to be selectively irradiated onto the photo resist film 403a through the photo mask 100, which is aligned over the substrate 350 and includes the mask patterns 101. The exposing process using the mask patterns 101 for the fine pattern formation causes diffracted light to be irradiated onto regions of the photo resist film 403a, so that the photo resist film 403a is patterned in a width range of about 2~2.5 μm.

More specifically, the wing portions 107 of the mask patterns 101 for the fine pattern formation cause offset-interference phenomena of light 111, thereby forcing diffracted light not to be irradiated onto a region of the photo resist film 403a opposite to the body portions 105 of the mask patterns 101. As such, regions of the photo resist film 403a corresponding to the wing portions 107 and the outer regions thereof on the photo mask 100 can be removed. Accordingly, the photo resist film 403a can be patterned in a width narrower than the length of the body portion 105 of the mask pattern 101 for the fine pattern formation. In other words, the photo resist film 403a can be patterned in a width range of about 2~2.5 µm.

Afterward, a developing process is performed for the light-exposed photo resist film 403a, so as to remove a part of the photo resist film 403a corresponding to the light-exposed regions. Accordingly, photo resist patterns 403b are formed on the transparent conductive layer 318a.

Figure 8C:
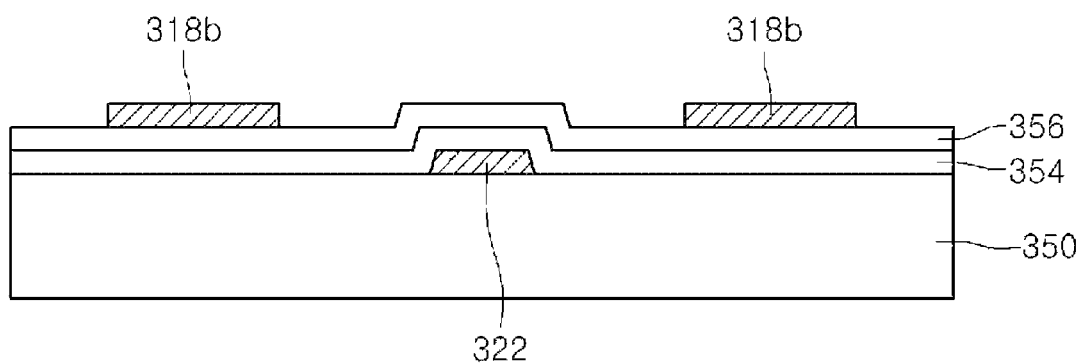

As shown in FIG. 8C, fingers of a pixel electrode 318b are formed on the passivation film 356 by etching the transparent conductive layer 318a using the photo resist patterns 403b as an etch mask. Then, the photo resist patterns 403b are removed by performing a strip process for the substrate 350 with the pixel electrode 318b, so that the fine pattern formation process of the present embodiment is completed. The finger of the pixel electrode 318b has a line width of 1.5~2.0 µm narrower than that of the photo resist pattern 403b. This results from the fact that the transparent conductive layer 318a is over-etched due to the characteristic of the etching process.

As described above, the photo mask and the IPS mode LCD device manufacturing method using the same, according to embodiments of the present disclosure, allow the line width of the pixel electrode to be reduced to a range of about 1.5~2.0 µm. Therefore, the aperture ratio of the IPS mode LCD device can be enhanced.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A method of manufacturing an in-plane-switching mode liquid crystal display device, comprising:
   sequentially forming a conductive layer and a photo resist film on a substrate;
   aligning a photo mask with a mask pattern for a fine pattern formation over the substrate covered with the photo resist film;
   patterning the photo resist film by performing an exposing process using the photo mask and a developing process; and
   forming an electrode by etching the conductive layer using the photo resist pattern as an etch mask,
   wherein the photo mask includes a mask substrate and mask patterns disposed between opposite first and second side ends on the mask substrate,
   wherein the mask pattern for the fine pattern formation is formed to include a plurality of unit mask patterns arranged in a single line, and each of the unit mask patterns is configured to include a body portion positioned at a center and wing portions formed in a triangular shape at both sides of the body portion, and
   wherein the body portion is formed to have a length corresponding to a ratio of 2:1 to a height of the wing portion, and the wing portion of the triangular shape is formed to have an apex angle of substantially 90°.

2. The method claimed as claim 1, wherein the electrode is configured to include a pixel electrode, and the conductive layer is configured include a transparent conductive layer.

3. The method claimed as claim 1, wherein the electrode is formed in a line width range of about 1.5 .about.2.0 µm.

4. The method claimed as claim 1, further comprising:
   forming a gate electrode on the substrate;
   forming a gate insulation film on the substrate with the gate electrode;
   forming a semiconductor pattern, a source electrode, and a drain electrode on the substrate covered with the gate insulation film; and
   forming a passivation film, on the substrate with the source and drain electrodes, configured to include a contact hole which is formed by patterning the passivation film, before the conductive layer and the photo resist film are sequentially formed.

* * * * *